United States Patent
Takeuchi (10) Patent No.: US 7,847,645 B2
(45) Date of Patent: Dec. 7, 2010

(54) OSCILLATION CONTROL APPARATUS AND OSCILLATOR

(75) Inventor: Hisato Takeuchi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 88 days.

(21) Appl. No.: 12/261,544

(22) Filed: Oct. 30, 2008

(65) Prior Publication Data
US 2009/0108950 A1    Apr. 30, 2009

(30) Foreign Application Priority Data
Oct. 30, 2007  (JP) .................. P. 2007-282007

(51) Int. Cl.
*H03L 7/099*    (2006.01)
(52) U.S. Cl. .................. 331/74; 331/183; 331/186
(58) Field of Classification Search .................. 331/74, 331/182, 183, 185, 186
See application file for complete search history.

(56) References Cited

U.S. PATENT DOCUMENTS

| | | | |
|---|---|---|---|
| 3,988,694 A | | 10/1976 | Yamazaki |
| 5,532,640 A | * | 7/1996 | Okunaga .................. 327/537 |
| 5,545,941 A | * | 8/1996 | Soneda et al. ............... 310/318 |
| 7,123,113 B1 | | 10/2006 | Brennan et al. |

FOREIGN PATENT DOCUMENTS

| | | |
|---|---|---|
| JP | 59-096905 | 6/1984 |
| JP | 2007-53746 | 3/2007 |

* cited by examiner

*Primary Examiner*—Robert Pascal
*Assistant Examiner*—James E Goodley
(74) *Attorney, Agent, or Firm*—McDermott Will & Emery (57) ABSTRACT

An oscillation control apparatus is provided with: an oscillating unit for oscillating an oscillating element; an output amplifying circuit having two pieces of same types of transistors series-connected to each other, for outputting a signal from a junction point between the two transistors in response to an oscillation signal outputted from the oscillating unit; a bias unit for generating two DC bias voltages having different levels from each other, which are applied to either respective gates or respective bases of the two transistors; a constant voltage power supply unit for applying a constant voltage to the oscillating unit; and an inverter unit provided between the oscillating unit and any one of either the gates or the bases of the two transistors, for inverting a phase of the oscillation signal outputted from the oscillating unit. Both the oscillation signal outputted from the oscillating unit and one of the two bias voltages are applied to either the gate or the base of one of the two transistors; and both an oscillation signal outputted from the oscillating unit and whose phase has been inverted by the inverting unit and the other bias voltage of the two bias voltages are applied to either the gate or the base of the other transistor of the two transistors.

18 Claims, 5 Drawing Sheets

OSCILLATION CONTROL APPARATUS AND OSCILLATOR

BACKGROUND OF THE INVENTION

1. Field of the Invention

The present invention is related to an oscillation control apparatus and an oscillator, which control amplitude and a level of an output signal.

2. Description of the Related Art

Since influences for lowering voltages of systems where oscillators are utilized are given to these oscillators, various sorts of development capable of lowering voltages of these oscillators have been carried out. For instance, although such oscillators have been available which can be operated in systems where a power supply voltage of 2.4 V has been employed, other oscillators operable in such systems that a power supply voltage of 1.8 V is employed are being developed. For instance, a patent publication 1 and a patent publication 2 have disclosed oscillators operable under low voltages.

Figure 7:
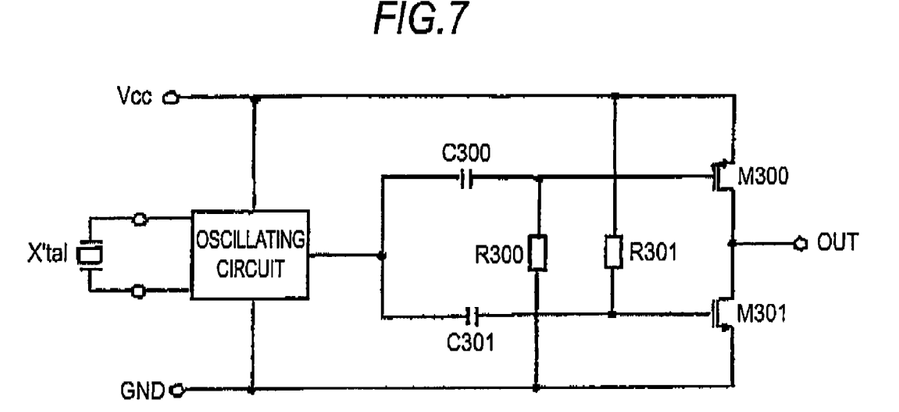
FIG. 7 is a circuit diagram for indicating the oscillator disclosed in the patent publication 2.

FIG. 7 is a circuit diagram for indicating the oscillator disclosed in the patent publication 2. Since the oscillator shown in FIG. 7 has employed CMOS transistors M300 and M301 as an output amplifying circuit, a signal having such a waveform approximated to a rectangular waveform is outputted. However, since the signal having the waveform approximated to the rectangular waveform largely contains higher harmonic wave components, the oscillator represented in FIG. 7 is not suitably employed as an oscillator which is utilized in the communication field. This reason is given as follows: That is, the higher harmonic waves contained in the output signal may give an adverse influence to carrier signals.

As a result, an oscillator capable of reducing higher harmonic wave components contained in an output signal has been developed. In order to reduce the higher harmonic wave components, output waveforms must be approximated to SIN waves, or clipped SIN waves. To this end, an output amplifying circuit has been constructed not by the CMOS transistors shown in FIG. 7, but by source follower type NMOS transistors.

Figure 8:
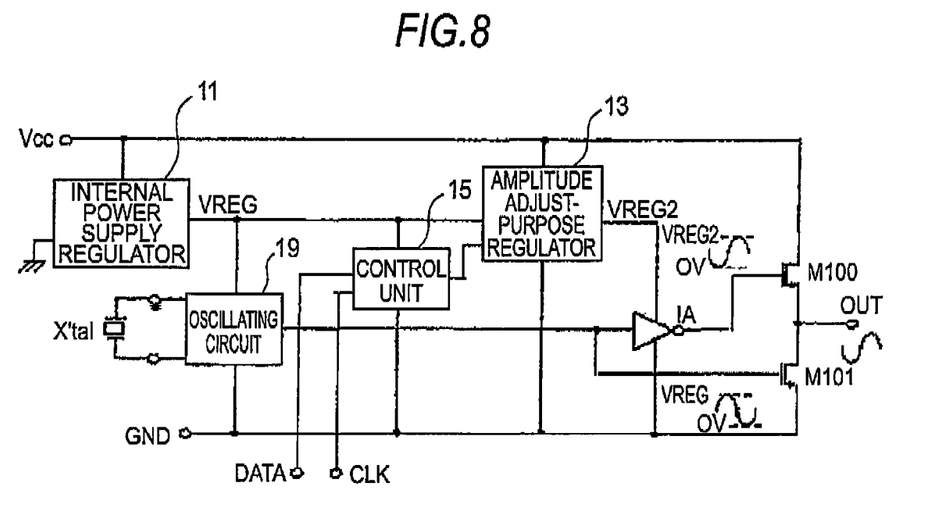
FIG. 8 is a circuit diagram for showing the oscillator containing the output amplifying circuit arranged by the source follower type NMOS transistors.
Figure 9:
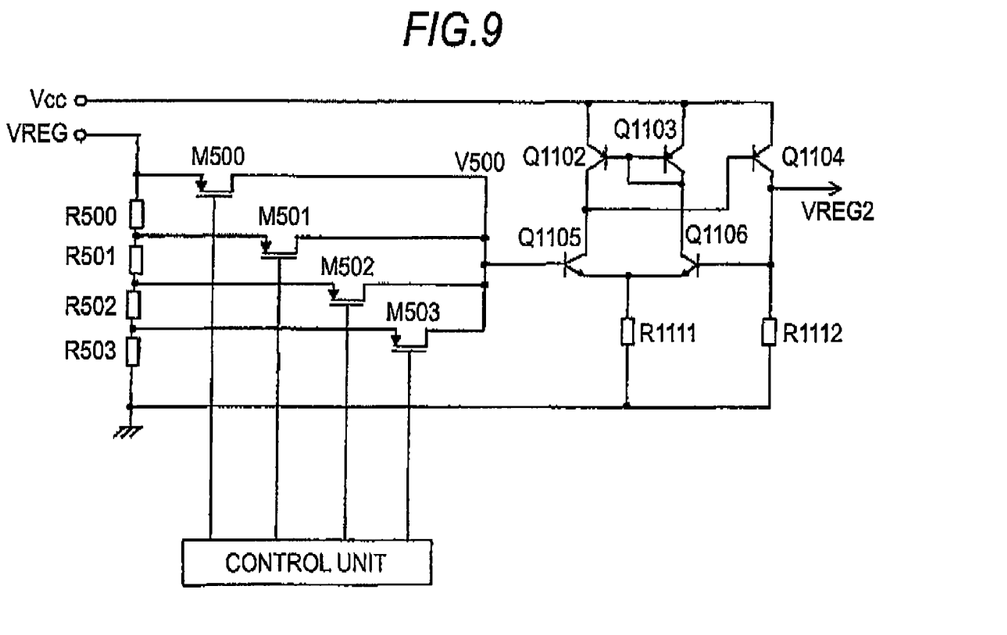
FIG. 9 is a circuit diagram for indicating the internal arrangement of the amplitude adjust-purpose regulator 13.

FIG. 8 is a circuit diagram for indicating an oscillator having the output amplifying circuit constructed of the source follower type NMOS transistors. The oscillator shown in FIG. 8 is equipped with two sets of regulators, namely, an internal power supply regulator 11, and an amplitude adjust-purpose regular 13. FIG. 9 is a circuit diagram for indicating an internal arrangement of the amplitude adjust-purpose regulator 13. As shown in FIG. 9, the amplitude adjust-purpose regulator 13 outputs a voltage "VREG2" controlled by a control unit 15. It should be noted that a maximum voltage that can be outputted by the amplitude adjust-purpose regulator 13 is such a voltage value obtained by subtracting a collector-to-emitter saturation voltage of a transistor Q1104 from a power supply voltage "Vcc."

In the oscillator shown in FIG. 8, in order to output a signal having an amplitude (VH−VL) of 1 Vpp, 1.8 V is required as the voltage "VREG2" of the amplitude adjust-purpose regulator 13 (this reason will be explained later). In order that the amplitude adjust-purpose regulator 13 outputs the voltage "VREG2" which is lowered from the power supply voltage Vcc by the collector-to-emitter saturation voltage (namely, 0.2 V) of the transistor Q1104, the power supply voltage Vcc of 2.0 V (=1.8+0.2 V) is required to be applied to the amplitude adjust-purpose regulator 13. In other words, the oscillator shown in FIG. 8 cannot be properly operated under such a lower voltage than, or equal to 2.0 V.

Figure 10:
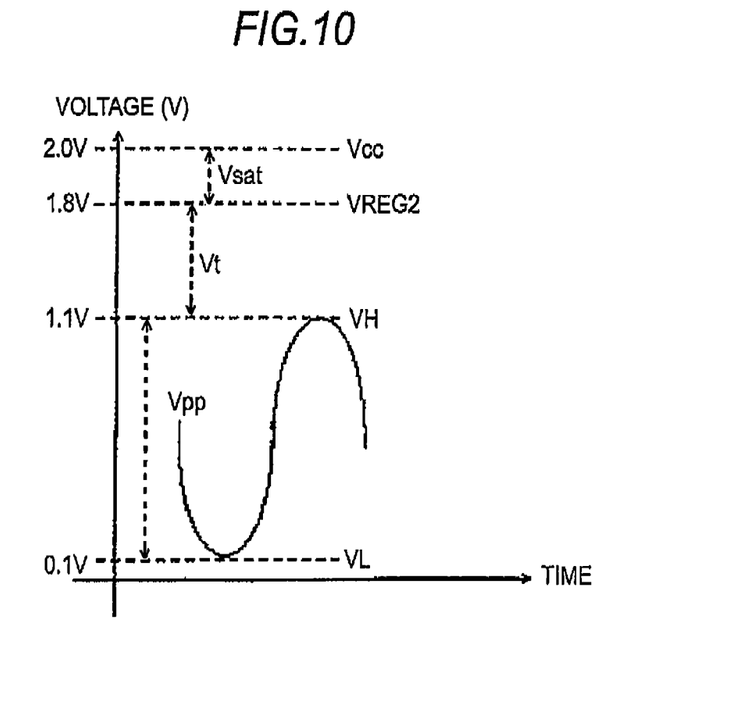
FIG. 10 is a diagram for representing the relation among the amplitude Vpp of the output signal of the oscillator shown in FIG. 8, the voltage VREG2 of the amplitude adjust-purpose regulator 13, and the power supply voltage Vcc.

Referring now to FIG. 10, a description is made of the reason why the voltage of 1.8 V is required as the above-described voltage "VREG2" of the amplitude adjust-purpose regulator 13 in order that the amplitude of the output signal becomes 1 Vpp. FIG. 10 is a diagram for graphically representing a relation among the amplitude Vpp of the output signal of the oscillator shown in FIG. 8, the voltage VREG2 of the amplitude adjust-purpose regulator 13, and the power supply voltage Vcc. A signal outputted from an output terminal "OUT" shown in FIG. 8 is changed in response to an output signal of an oscillating circuit 19. A phase of a gate voltage of an NMOS transistor M101 is the same phase of the output signal of the oscillating circuit 19. On the other hand, since an inverter amplifier "IA" has been provided between the oscillating circuit 19 and a gate of another NMOS transistor M100, a phase of this gate voltage of the NMOS transistor M100 is opposite to the phase of the output signal of the oscillating circuit 19. The phase of the signal outputted from the output terminal OUT is opposite to a phase of a voltage applied to the gate of the NMOS transistor M101.

A maximum voltage "VH" of a signal outputted from the output terminal OUT is expressed by the below-mentioned formula (1):

$$VH = Vgmax - Vt \qquad (1)$$
$$= VREG2 - Vt$$

It should be noted that symbol "Vmax" indicates a maximum value of a gate voltage of the NMOS transistor M100, and symbol "Vt" indicates a threshold voltage of the gate of the NMOS transistor M100.

The gate voltage of the NMOS transistor M100 is increased up to the power supply voltage VREG2 of the inverter amplifier IA (Vgmax=VREG2). As a consequence, the voltage VREG2 of the amplitude adjust-purpose regulator 13 corresponding to the power supply voltage of the power supply voltage VREG2 of the inverter amplifier IA is adjusted, so that the maximum voltage VH of the signal outputted from the output terminal OUT may be adjusted.

On the other hand, a minimum voltage "VL" of a signal outputted from the output terminal OUT is expressed by the below-mentioned formula (2):

$$VL = VH - Vpp \qquad (2)$$
$$= VREG2 - Vt - Vpp$$

However, the above-described minimum voltage VL is restricted by a drain-to-source saturation voltage $V_{DS}$ of the NMOS transistor M101 when the NMOS transistor M101 is under ON status, namely, when the gate voltage of the NMOS transistor M101 is in an H level.

In this case, assuming now that the minimum voltage VL is designed to be 0.1 V, in order that the signal outputted from the output terminal OUT has such an amplitude (=VH−VL) of 1 Vpp, the maximum voltage VH is required to be equal to 1.1 V (VH=1.1 V). As a consequence, since the voltage VREG2 of the amplitude adjust-purpose regulator 13 is equal to VH+Vt based upon the above-described formula (1), this voltage VREG2 is required to be 1.8V (=1.1+0.7 V).

It should be understood that, as previously described, since the voltage value obtained by subtracting the collector-to-emitter saturation voltage Vsat of the transistor Q1104 contained in the amplitude adjust-purpose regulator 13 from the power supply voltage Vcc becomes the voltage VREG2 of the amplitude adjust-purpose regulator 13, assuming now that the saturation voltage Vsat is equal to 0.2 V, such a power supply voltage Vcc of 2.0 V (=1.8+0.2 V) is required.

Patent Publication 1: JP-UM-A-59-096905

Patent Publication 2: JP-A-2007-53746

As previously described, the signal outputted from the oscillator shown in FIG. 7 contains the large amounts of higher harmonic wave components. Also, in accordance with the oscillator shown in FIG. 8, since the output amplifying circuit has been arranged by the source follower type NMOS transistors, the higher harmonic wave components of the output terminal are reduced, and on the other hand, the oscillator of FIG. 8 cannot be properly operated at the lower voltages than, or equal to 2.0 V in order to output the signal having the amplitude of 1 Vpp.

SUMMARY OF THE INVENTION

An object of the present invention is to provide an oscillation control apparatus and an oscillator, capable of being operated under lower voltages, while higher harmonic wave components contained in an output signal thereof are small.

The present invention is to provide an oscillation control apparatus which is comprised of: an oscillating unit for oscillating an oscillating element; an output amplifying circuit having two pieces of same types of transistors series-connected to each other, for outputting a signal from a junction point between the two transistors in response to an oscillation signal outputted from the oscillating unit; a bias unit for generating two DC bias voltages having different levels from each other, which are applied to either respective gates or respective bases of the two transistors; a constant voltage power supply unit for applying a constant voltage to the oscillating unit; and an inverter unit provided between the oscillating unit and any one of either the gates or the bases of the two transistors, for inverting a phase of the oscillation signal outputted from the oscillating unit; in which: both the oscillation signal outputted from the oscillating unit and one of the two bias voltages are applied to either the gate or the base of one of the two transistors; and both an oscillation signal outputted from the oscillating unit and whose phase has been inverted by the inverting unit and the other bias voltage of the two bias voltages are applied to either the gate or the base of the other transistor of the two transistors.

The present invention is to provide an oscillation control apparatus which is comprised of: an oscillating unit for oscillating an oscillating element; an output amplifying circuit having two pieces of same types of transistors series-connected to each other, for outputting a signal from a junction point between the two transistors in response to an oscillation signal outputted from the oscillating unit and a signal having a phase opposite to the phase of the oscillation signal, which is entered to the oscillating unit; a bias unit for generating two bias voltages having different levels from each other, which are applied to either respective gates or respective bases of the two transistors; and a constant voltage power supply unit for applying a constant voltage to the oscillating unit; in which: both the signal entered to the oscillating unit and one of the two bias voltages are applied to either the gate or the base of one of the two transistors; and both the oscillation signal outputted from the oscillating unit and the other bias voltage of the two bias voltages are applied to either the gate or the base of the other transistor of the two transistors.

The above-described oscillation control apparatus is equipped with a DC component eliminating unit for eliminating a DC component of signals entered to either the respective gates or the respective bases of the two transistors before being biased by the bias voltages.

The above-described oscillation control apparatus is equipped with an AC component eliminating unit for eliminating an AC component of the bias voltages generated by the bias unit.

In the oscillation control apparatus, the above-described two transistors are N type MOS transistors.

In the above-explained oscillation control apparatus, said bias unit includes: a first bias voltage generating unit for outputting one bias voltage of the two bias voltages; and a second bias voltage generating unit for outputting the other bias voltage of the two bias voltages; and each of the first and second bias voltage generating units includes: a plurality of voltage dividing units for dividing the constant voltage applied from the constant voltage power supply unit based upon different voltage dividing ratios; and a switch unit for switching paths routed from the plurality of voltage dividing units up to an output in such a manner that any one of the voltages divided by the plurality of voltage dividing units is outputted.

The present invention is to provide an oscillator equipped with an oscillating element, and the above-described oscillation control apparatus for oscillating the oscillating element.

In accordance with the oscillation control apparatus and the oscillator, which are related to the present invention, the oscillation control apparatus and the oscillator can be operated under low voltages, while higher harmonic wave components contained in output signals thereof are reduced.

DESCRIPTION OF THE PREFERRED EMBODIMENTS

Referring now to drawings, a description is made of embodiment modes of the present invention.

First Embodiment Mode

Figure 1:
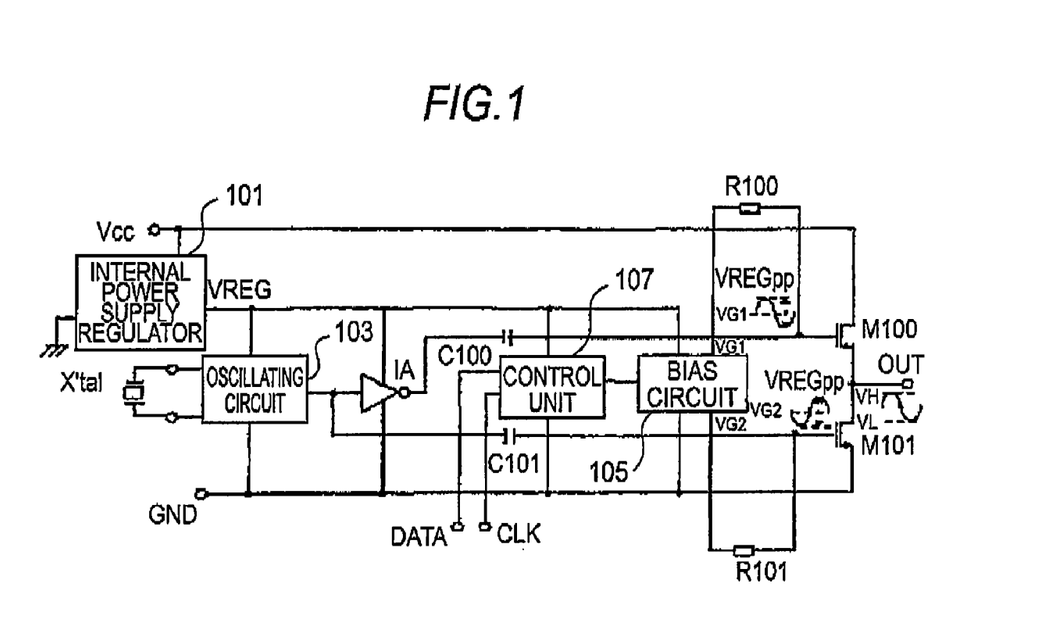
FIG. 1 is a circuit diagram for indicating an oscillation control apparatus according to a first embodiment mode of the present invention.

FIG. 1 is a circuit diagram for indicating an oscillation control apparatus of a first embodiment mode of the present invention. As shown in FIG. 1, the oscillation control apparatus of the first embodiment mode is equipped with an internal power supply regular 101, a quartz oscillator "X'tal", an oscillating circuit 103, an amplitude adjust-purpose bias circuit (will be simply referred to as "bias circuit" hereinafter) 105, a control unit 107, an inverter amplifier IA, capacitors C100 and C101, resistors R100 and R101, and also, an output amplifying circuit. The output amplifying circuit has been formed by two N type MOS transistors (will be referred to as "MNOS transistors" hereinafter) M100 and M101. The NMOS transistors M100 and M101 are constructed of source follower type, and have been series-connected to each other. An output terminal "OUT" of the oscillation control apparatus has been provided at a source of the NMOS transistor M100 (namely, drain of NMOS transistor M101). A signal that is outputted from the output terminal OUT is changed in response to an output signal of the oscillating circuit 103. It should be understood that the quartz oscillator X'tal may be alternatively and separately provided with respect to the oscillation control apparatus of the first embodiment mode.

A power supply voltage "Vcc" is applied to both the internal power supply regulator 101 and the output amplifying circuit. Also, a voltage "VREG" of the internal power supply regulator 101 is applied to the oscillating circuit 103, the inverter amplifier IA, the control unit 107, and the bias circuit 105. The output signal of the oscillating circuit 103 is supplied via the inverter amplifier IA and the capacitor C100 to the gate of the NMOS transistor M100, and further, is supplied via the capacitor C101 to the gate of the NMOS transistor M101. The inverter amplifier IA inverts a phase of the output signal of the oscillating circuit 103. The capacitors C100 and C101 eliminate a DC component contained in the output signal of the oscillating circuit 103, before being biased by DC bias voltages "VG1" and "VG2" generated by the bias circuit 105 (will be discussed later).

Also, the bias voltages VG1 and VG2 having different levels from each other, which are generated from the bias circuit 105, are applied via the resistors R100 and R101 to the gates of the NMOS transistors M100 and M101 respectively. The resistors R100 and R101 remove AC components of the bias voltages VG1 and VG2 generated from the bias circuit 105. The control unit 107 controls the bias voltages VG1 and VG2 outputted from the bias circuit 105 based upon data entered from an external source (not shown).

Figure 2:
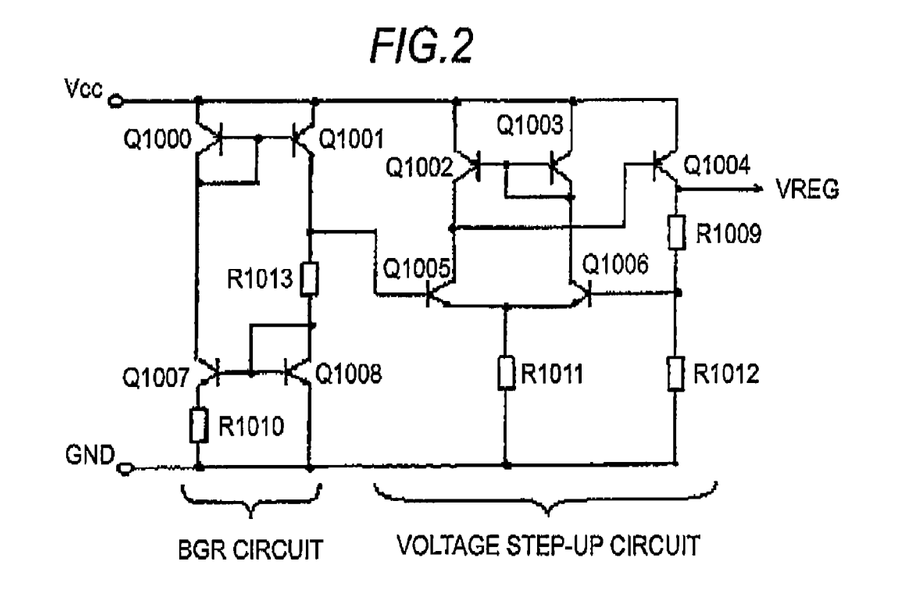
FIG. 2 is a circuit diagram for showing an internal arrangement of an internal power supply regulator 101 provided in the oscillation control apparatus of the first embodiment mode.

FIG. 2 is a circuit diagram for showing an internal arrangement of the internal power supply regulator 101 that is provided in the oscillation control apparatus of the first embodiment mode. As shown in FIG. 2, the internal power supply regulator 101 outputs the voltage "VREG." A maximum voltage which can be outputted by the internal power supply regulator 101 is such a voltage obtained by subtracting a collector-to-emitter saturation voltage "$V_{CE}$" of a transistor Q1104 from the power supply voltage Vcc.

Figures 3A, 3B:
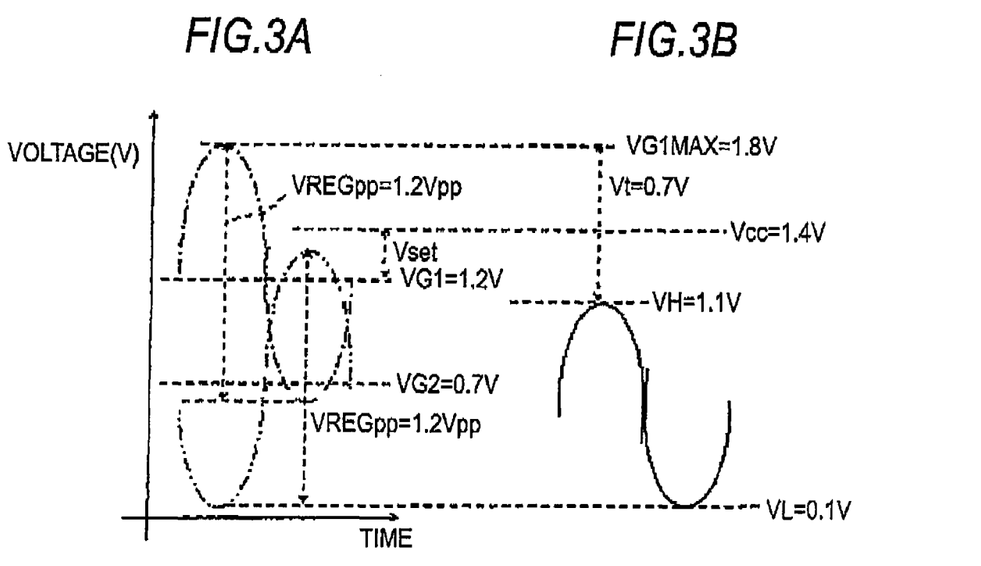
FIG. 3A is a diagram for showing a voltage which is applied to the respective gates of the NMOS transistors M100 and M101 of the oscillation control apparatus of the first embodiment mode.
FIG. 3B is a diagram for indicating an output signal of the oscillation control apparatus.

Next, referring now to FIG. 3, a description is made of operations of the oscillation control apparatus of the first embodiment mode. FIG. 3A is a diagram for representing voltages that are applied to the gates of the NMOS transistor M100 and M101 of the oscillation control apparatus according to the first embodiment mode, and FIG. 3B is a diagram for showing an output signal of the oscillation control apparatus. It should also be noted that a dot and dash line shown in FIG. 3(a) indicates a voltage that is applied to the gate of the NMOS transistor M100, and a two-dot and dash line indicates a voltage that is applied to the gate of the NMOS transistor M101.

A phase of a voltage that is applied to the gate of the NMOS transistor M101 is the same phase of the output signal of the output signal of the oscillating circuit 103. Also, an amplitude Vpp and a duty cycle of the voltage applied to this gate of the NMOS transistor M101 are determined based upon the power supply voltage of the oscillating circuit 103, namely the voltage VREG of the internal power supply regulator 101, and is biased by a bias voltage "VG1" which is applied from the bias circuit 105 to this gate. On the other hand, since the inverter amplifier IA has been provided between the oscillating circuit 103 and the NMOS transistor M100, a phase of a voltage which is applied to the gate of this NMOS transistor M100 is opposite to the phase of the output signal of the oscillating circuit 103. Also, an applitude Vpp of the voltage applied to this gate of the NMOS transistor M100 is determined based upon the power supply voltage of the oscillating circuit 103, namely the voltage VREG of the internal power supply regulator 101, and is biased by a bias voltage "VG2" which is applied from the bias circuit 105 to this gate. A phase of a signal outputted from the output terminal OUT is opposite to the phase of the voltage that is applied to the gate of the NMOS transistor M101.

A maximum voltage "VH" of a signal outputted from the output terminal OUT is expressed by the below-mentioned formula (3):

$$VH = VG1MAX - Vt \quad (3)$$

It should also be noted that symbol "VG1MAX" is a maximum value of a voltage that is applied to the gate of the NMOS transistor M100, and symbol "Vt" represents a threshold voltage of the gate of the NMOS transistor M100.

The maximum gate voltage VG1MAX is determined based upon both the bias voltage VG1 and the amplitude "VGERpp" of the voltage applied to the gate of the NMOS transistor M100, and is expressed by VG1MAX=VG1+VREGpp/2. As a consequence, the maximum voltage "VH" is given by the below-mentioned formula (4):

$$VH(=VG1MAX-Vt)=VG1+VREGpp/2-Vt \quad (4).$$

As represented in the formula (4), the maximum voltage VH may be adjusted by changing the bias voltage VG1 and the voltage VREG of the internal power supply regulator 101.

On the other hand, a minimum voltage "VL" of a signal outputted from the output terminal OUT is expressed based upon the below-mentioned formula (5):

$$VL = VG2 - VREGpp/2 \quad (5)$$

As represented in the formula (5), the minimum voltage VL may be adjusted by changing the bias voltage VG2 and the voltage GREG of the internal power supply regulator 101. It should also be noted that the minimum voltage VL is limited based upon the drain-to-source saturation voltage $V_{DS}$ of the NMOS transistor M101 when the NMOS transistor M101 is under ON status, namely when the gate voltage of the NMOS transistor M101 is in an H level. As a consequence, both the bias voltage VG2 and the voltage VREG of the internal power supply regulator 101 are set in such a manner that the minimum voltage VL obtained by the above-described formula (5)

becomes higher than, or equal to the drain-to-source saturation voltage $V_{DS}$ of the NMOS transistor M101.

It should also be noted that the voltage VREG of the internal power supply regulator 101 is determined by the below-mentioned formula (6):

$$VREG=Vcc-Vsat \qquad (6)$$

It should also be understood that symbol "Vcc" shows a power supply voltage, and symbol "Vsat" indicates a collector-to-emitter saturation voltage $V_{CE}$ of the transistor Q1004 (shown in FIG. 2) employed in the internal power supply regulator 101.

Based upon the above-described explanation, a description is made of a setting operation in order that the signal outputted from the output terminal OUT has the amplitude (=VH−VL) of 1 Vpp in this first embodiment mode. In such a case that the drain-to-source saturation voltage $V_{DS}$ of the NMOS transistor M101 is 0.1 V, and the minimum voltage VL of the signal outputted from the output terminal OUT is 0.1 V, the maximum voltage VH is required to be VH=1.1 V (=0.1+1.0 V) in order to obtain the amplitude of 1 Vpp. Since such a relation of VG1MAX=VH+Vt may be obtained based upon the above-described formula (3), assuming now that the threshold voltage Vt of the gate of the NMOS transistor M100 is equal to 0.7 V, the maximum gate voltage VG1MAX of the NMOS transistor M100 is required to be equal to 1.8 V (=1.1+0.7 V). In other words, it is required that the voltage applied to the gate of the NMOS transistor M100 is increased up to 1.8 V.

In this case, assuming now that the bias voltage VG=1.2 V, the voltage VREG of the internal power supply regulator 101 is required to be equal to 1.2 V (namely, VREG=(1.8 V−VG1)×2=1.2 V) based upon such a relation of VG1MAX=1.8 V=VG1+VREGpp/2. Assuming now that the collector-to-emitter saturation voltage Vsat of the transistor Q1004 employed in the internal power supply regulator 101 is equal to 0.2 V, such a relation of Vcc=VREG+Vsat may be obtained based upon the above-described formula (6). As a result, it may be obtained that the power supply voltage Vcc is equal to 1.4 V (=1.2+0.2 V). As previously described, in this first embodiment mode, in such a case that a minimum voltage VL of a signal outputted from the output terminal OUT is 0.1 V, the power supply voltage Vcc may have a voltage of 1.4 V in order that this output signal may have the amplitude of 1 Vpp.

It should also be understood that in order that the minimum voltage VL of the signal outputted from the output terminal OUT is equal to 0.1 V (VL=0.1 V), the bias voltage VG2 may be selected to be 0.7 V (namely, VG2=0.7 V=0.1+0.6 V) due to the below-mentioned reason: That is, such a relation of "VG2=VL+VREGpp/2" is obtained from the above-described formula (5), so that the voltage VREG of the internal power supply regulator 101 is equal to 1.2 V. As previously described, if the bias circuit 105 outputs one bias voltage of VG1=1.2 V and another bias voltage of VG2=0.7 V and the power supply voltage Vcc is equal to 1.4 V, then such a signal having an amplitude of 1 Vpp is outputted from the output terminal OUT. Conversely speaking, in order that the oscillation control apparatus of the first embodiment mode outputs the signal having the amplitude of 1 Vpp, it is sufficient that the below-mentioned voltages may be set as follows: the bias voltage VG1=1.2 V, the bias voltage VG2=0.7 V, and the power supply voltage Vcc=1.4 V.

Figure 4:
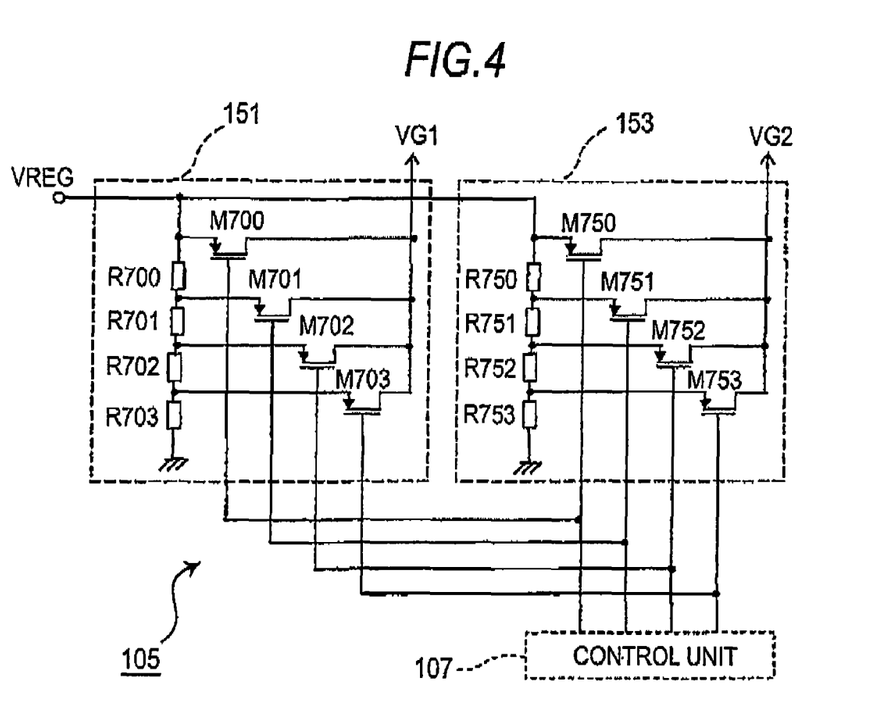
FIG. 4 is a circuit diagram for showing an internal arrangement of a bias circuit 105 provided in the oscillation control apparatus of the first embodiment mode.

As previously described, in the first embodiment mode, two different bias voltages VG1 and VG2 must be generated inside the oscillation control apparatus. FIG. 4 is a circuit diagram for showing an internal arrangement of the bias circuit 105 provided in the oscillation control apparatus of the first embodiment mode. The bias circuit shown in FIG. 4 contains a first bias voltage generating unit 151 for generating the bias voltage VG1 and a second bias voltage generating unit 153 for generating the bias voltage VG2. Each of the first and second bias voltage generating units 151 and 153 contains 4 pieces of MOS transistors connected parallel to each other, and 4 pieces of resistors connected series to each other. While voltages produced by dropping the voltage VREG of the internal power supply regulator 101 by these four resistors are applied to drains of the respective MOS transistors, signals derived from the control unit 107 are inputted to gates of these MOS transistors.

For instance, the first bias voltage generating unit 151 contains 4 pieces of MOS transistors M700 to M703, and 4 pieces of resistors R700 to R703. The voltage VREG is applied to the drain of the MOS transistor M700; a voltage produced by dropping the voltage VREG by utilizing the resistor R700 is applied to the drain of the MOS transistor M701; a voltage produced by dropping the voltage VREG by utilizing the resistor R700 and the resistor R701 is applied to the drain of the MOS transistor M702; and a voltage produced by dropping the voltage VREG by utilizing the resistor R700 to the resistor M702 is applied to the drain of the MOS transistor M703. It should also be noted that only one MOS transistor among the four MOS transistors M700 to M703 is brought into an ON status, and a source voltage of this MOS transistor under ON status is outputted as the bias voltage VG1. The above-described voltage setting condition may be similarly applied also to the second bias voltage generating unit 153.

In accordance with the above-descried arrangement, a bias voltage VG1 having any one of the four different voltage values, and another bias voltage GV2 having any one of the four difference voltage values are outputted from the bias circuit 105. As previously described, both the maximum voltage VH and the minimum voltage VL of the signal outputted from the output terminal OUT are changed in response to the magnitudes of the bias voltages VG1 and VG2 (refer to formulae (4) and (5)). As a consequence, since the bias voltages VG1 and VG2 are controlled, the maximum voltage VH, the minimum voltage VL, and the amplitude Vpp (=VH−VL) of the signal outputted from the output terminal OUT can be adjusted.

Figure 5:
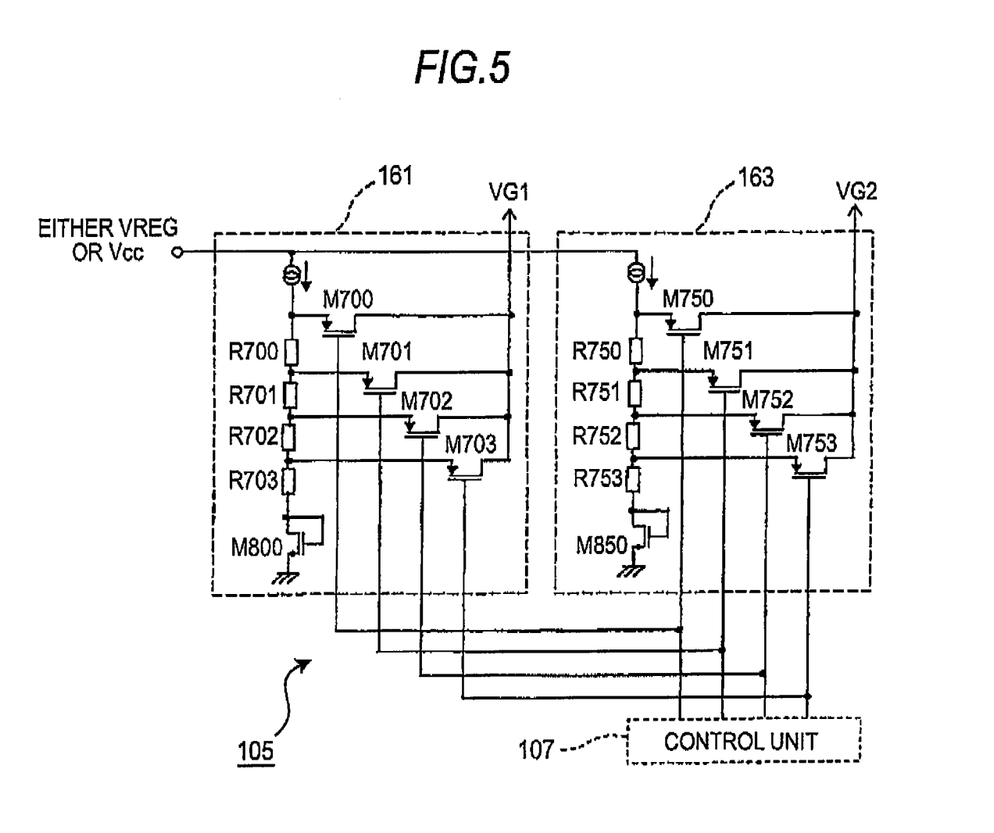
FIG. 5 is a circuit diagram for showing another mode of the internal arrangement of the bias circuit 105 provided in the oscillation control apparatus of the first embodiment mode.

FIG. 5 is a circuit diagram for showing another mode as to the internal arrangement of the bias circuit 105 that is provided in the oscillation control apparatus of the first embodiment mode. The bias circuit shown in FIG. 5 has the below-mentioned different points from the bias circuit shown in FIG. 4: That is, either the voltage VREG of the internal power supply regulator 101 or the power supply voltage Vcc is applied as a power supply voltage of the bias circuit 105; a current source has been provided in each of the bias voltage generating units; and further, MOS transistors (namely, threshold value fluctuation compensating transistors M800 and M850) capable of compensating manufacturing fluctuations as to the threshold voltages of the gates of the MOS transistors and also capable of canceling an adverse influence caused by temperature characteristics have been provided series to 4 resistors in each of the bias voltage generating units. It should also be noted that although resistors may be employed instead of the current sources, fluctuations may be increased.

In the case that the threshold voltages of the gates of the threshold value fluctuation compensating transistors M800 and M850 are high, the currents supplied from the current sources are increased. If a current supplied from a constant current source is increased, then the bias voltages are also increased. As indicated in the above-described formula (4), since such a relation of VH=VG1+VREGpp/2−Vt is established, an increase of the threshold voltage Vt for the gate of the NMOS transistor M100 can be compensated by an increase of the bias voltage VG1. Conversely, a decrease of the threshold voltage Vt for the gate of the NMOS transistor M100 can be compensated by a decrease of the bias voltage VG1.

It should also be understood that although the threshold voltages of the MOS transistors have the temperature characteristics, a variation in the temperature characteristics of the threshold voltage Vt for the gate of the NMOS transistor M100 may be similarly compensated based upon the threshold value fluctuation compensating transistors M800 and M850.

As previously described, in accordance with the oscillation control apparatus of the first embodiment mode, the signal having the desirable amplitude can be outputted from the output terminal OUT under the power supply voltage Vcc which is lower than that of the conventional oscillation control apparatus. Also, similar to the oscillator shown in FIG. 8, the output amplifying circuit has been arranged by the source follower type NMOS transistors, so that such a signal whose higher harmonic wave component is small can be outputted. Also, since only one set of the regulator has been provided, an area of an integrated circuit that constitutes the above-described oscillation control apparatus can be made small.

Furthermore, since the bias circuit 105 can output the two bias voltages VG1 and VG2 each having one voltage level selected from the plural levels, the maximum voltage VH, the minimum voltage VL, and the amplitude Vpp of the signal outputted from the output terminal OUT can be adjusted by controlling the respective bias voltage levels.

Second Embodiment Mode

Figure 6:
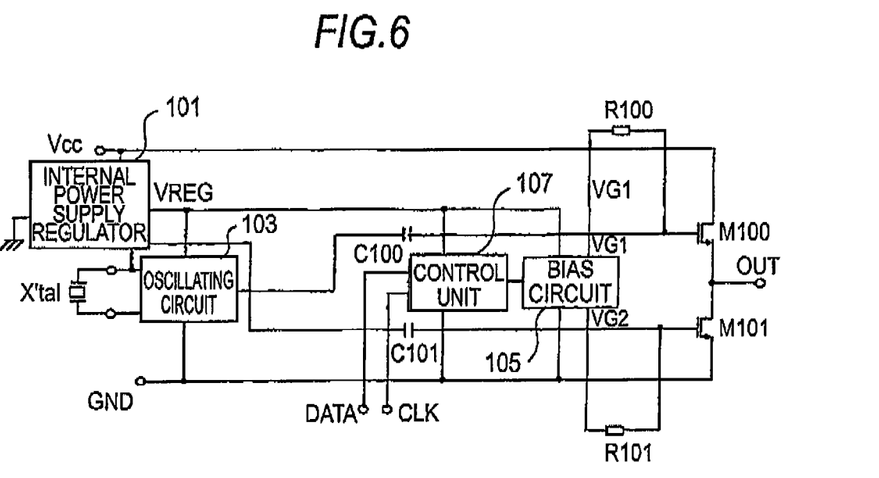
FIG. 6 is a circuit diagram for indicating an oscillation control apparatus according to a second embodiment mode of the present invention.

FIG. 6 is a circuit diagram for showing an oscillation control apparatus according to a second embodiment mode of the present invention. Different from the oscillation control apparatus of the first embodiment mode, the oscillation control apparatus of the second embodiment mode is not equipped with the above-described inverter amplifier IA. Also, an output signal of an oscillating circuit 103 is supplied via a capacitor C100 to a gate of an NMOS transistor M100, and, a signal entered from a quartz oscillator "X'tal" to the oscillating circuit 103 is supplied via a capacitor C101 to a gate of an NMOS transistor M101. While structural arrangements of the oscillation control apparatus other than the above-described structural arrangement are similar to those of the first embodiment mode, the same reference numerals shown in FIG. 1 have been applied to the similar structural elements shown in FIG. 6. It should be understood that similar to the first embodiment mode, a phase of the signal supplied to the gate of the NMOS transistor M100 is opposite to a phase of the signal supplied to the gate of the NMOS transistor M101. Since the oscillation control apparatus of the second embodiment mode is not equipped with the inverter amplifier IA, a circuit scale thereof can be reduced.

In the above-described first and second embodiment modes, the output amplifying circuit has been arranged by employing the NMOS transistors M100 and M101. Alternatively, the output amplifying circuit may be arranged by employing two pieces of emitter follower type bipolar transistors. Also, instead of the NMOS transistors, P type MOS transistors may be alternatively employed. Furthermore, both an NMOS transistor and an NPN transistor may be alternatively employed (N type and N type).

Moreover, the above-descried first and second embodiment modes have arranged in such a manner that the bias voltages have been applied to the gates of the two NMOS transistors M100 and M101 employed in the output amplifying circuit. Alternatively, only the gate of the NMOS transistor M100 may be biased.

The oscillation control apparatus according to the present invention is useful as an oscillator, and the like, which can be operated under low voltages, while an output signal thereof contains a small amount of higher harmonic wave components.

What is claimed is:

1. An oscillation control apparatus, comprising:
an oscillating unit oscillating an oscillating element;
an output amplifying circuit having two pieces of same types of transistors series-connected to each other, and an output terminal for outputting a signal from a junction point between said two transistors in response to an oscillation signal outputted from the oscillating unit;
a bias unit generating two DC bias voltages having different levels from each other, which are applied to either respective gates or respective bases of said two transistors;
a constant voltage power supply unit applying a constant voltage to said oscillating unit; and
an inverter unit provided between said oscillating unit and any one of either said gates or said bases of the two transistors, and inverting a phase of said oscillation signal outputted from said oscillating unit; wherein:
the oscillation signal outputted from said oscillating unit and one of said two bias voltages are applied to either the gate or the base of one of said two transistors a,
an oscillation signal outputted from said oscillating unit and whose phase has been inverted by said inverting unit and the other bias voltage of said two bias voltages are applied to either the gate or the base of the other transistor of said two transistors, and
the two DC bias voltages are VG1 and VG2 which are represented by:

$VG1 = VH + Vt - VREGpp/2,$ $VG2 = VL + VREGpp/2,$ where

VH is a maximum voltage of a signal output from the output amplifying circuit,
VL is a minimum voltage of the signal output from the output amplifying circuit,
Vt is a threshold voltage of the transistors, and
VREGpp is peak-to-peak amplitude of voltage applied to the gate or the base.

2. An oscillation control apparatus, comprising:
an oscillating unit oscillating an oscillating element;
an output amplifying circuit having two pieces of same types of transistors series-connected to each other, and an output terminal for outputting a signal from a junction point between said two transistors in response to an oscillation signal outputted from the oscillating unit and a signal having a phase opposite to the phase of said oscillation signal which is entered to said oscillating unit;
a bias unit generating two bias voltages having different levels from each other, which are applied to either respective gates or respective bases of said two transistors; and a constant voltage power supply unit applying a constant voltage to said oscillating unit; wherein:

the signal entered to said oscillating unit and one of said two bias voltages are applied to either the gate or the base of one of said two transistors, the oscillation signal outputted from said oscillating unit and the other bias voltage of said two bias voltages are applied to either the gate or the base of the other transistor of said two transistors, and the two DC bias voltages are VG1 and VG2 which are represented by:

$VG1 = VH + Vt - VREGpp/2,$ $VG2 = VL + VREGpp/2,$ where

VH is a maximum voltage of a signal output from the output amplifying circuit,

VL is a minimum voltage of the signal output from the output amplifying circuit, Vt is a threshold voltage of the transistors, and VREGpp is peak-to-peak amplitude of voltage applied to the gate or the base.

3. The oscillation control apparatus as claimed in claim 1, further comprising:

a DC component eliminating unit eliminating a DC component of signals entered to either the respective gates or the respective bases of said two transistors before being biased by said bias voltages.

4. The oscillation control apparatus as claimed in claim 2, further comprising:

a DC component eliminating unit eliminating a DC component of signals entered to either the respective gates or the respective bases of said two transistors before being biased by said bias voltages.

5. An oscillation control apparatus, comprising:

an oscillating unit oscillating an oscillating element;

an output amplifying circuit having two pieces of same types of transistors series-connected to each other, and outputting a signal from a junction point between said two transistors in response to an oscillation signal outputted from the oscillating unit;

a bias unit generating two DC bias voltages having different levels from each other, which are applied to either respective gates or respective bases of said two transistors;

a constant voltage power supply unit applying a constant voltage to said oscillating unit;

an inverter unit provided between said oscillating unit and any one of either said gates or said bases of the two transistors, and inverting a phase of said oscillation signal outputted from said oscillating unit; and an AC component eliminating unit eliminating an AC component of said bias voltages generated by said bias unit, wherein:

the oscillation signal outputted from said oscillating unit and one of said two bias voltages are applied to either the gate or the base of one of said two transistors, and an oscillation signal outputted from said oscillating unit and whose phase has been inverted by said inverting unit and the other bias voltage of said two bias voltages are applied to either the gate or the base of the other transistor of said two transistors.

6. An oscillation control apparatus, comprising:

an oscillating unit oscillating an oscillating element;

an output amplifying circuit having two pieces of same types of transistors series-connected to each other, and outputting a signal from a junction point between said two transistors in response to an oscillation signal outputted from the oscillating unit and a signal having a phase opposite to the phase of said oscillation signal which is entered to said oscillating unit;

a bias unit generating two bias voltages having different levels from each other, which are applied to either respective gates or respective bases of said two transistors;

a constant voltage power supply unit applying a constant voltage to said oscillating unit; and an AC component eliminating unit eliminating an AC component of said bias voltages generated by said bias unit, wherein:

the signal entered to said oscillating unit and one of said two bias voltages are applied to either the gate or the base of one of said two transistors, and the oscillation signal outputted from said oscillating unit and the other bias voltage of said two bias voltages are applied to either the gate or the base of the other transistor of said two transistors.

7. The oscillation control apparatus as claimed in claim 1, wherein said two transistors are N type MOS (Metal Oxide Semiconductor) transistors.

8. The oscillation control apparatus as claimed in claim 2, wherein said two transistors are N type MOS (Metal Oxide Semiconductor) transistors.

9. An oscillation control apparatus, comprising:

an oscillating unit oscillating an oscillating element;

an output amplifying circuit having two pieces of same types of transistors series-connected to each other, and outputting a signal from a junction point between said two transistors in response to an oscillation signal outputted from the oscillating unit;

a bias unit generating two DC bias voltages having different levels from each other, which are applied to either respective gates or respective bases of said two transistors;

a constant voltage power supply unit applying a constant voltage to said oscillating unit; and an inverter unit provided between said oscillating unit and any one of either said gates or said bases of the two transistors, and inverting a phase of said oscillation signal outputted from said oscillating unit; wherein:

the oscillation signal outputted from said oscillating unit and one of said two bias voltages are applied to either the gate or the base of one of said two transistors, an oscillation signal outputted from said oscillating unit and whose phase has been inverted by said inverting unit and the other bias voltage of said two bias voltages are applied to either the gate or the base of the other transistor of said two transistors, said bias unit includes:

a first bias voltage generating unit outputting one bias voltage of said two bias voltages; and a second bias voltage generating unit outputting the other bias voltage of said two bias voltages, and each of said first and second bias voltage generating units includes:

a plurality of voltage dividing units dividing the constant voltage applied from said constant voltage power supply unit based upon different voltage dividing ratios; and a switch unit switching paths routed from said plurality of voltage dividing units up to an output in such a manner that any one of the voltages divided by said plurality of voltage dividing units is outputted.

10. An oscillation control apparatus, comprising:
an oscillating unit oscillating an oscillating element;
an output amplifying circuit having two pieces of same types of transistors series-connected to each other, and outputting a signal from a unction point between said two transistors in response to an oscillation signal outputted from the oscillating unit and a signal having a phase opposite to the phase of said oscillation signal which is entered to said oscillating unit;
a bias unit generating two bias voltages having different levels from each other, which are applied to either respective gates or respective bases of said two transistors; and
a constant voltage power supply unit applying a constant voltage to said oscillating unit; wherein:
the signal entered to said oscillating unit and one of said two bias voltages are applied to either the gate or the base of one of said two transistors,
the oscillation signal outputted from said oscillating unit and the other bias voltage of said two bias voltages are applied to either the gate or the base of the other transistor of said two transistors,
said bias unit includes:
a first bias voltage generating unit outputting one bias voltage of said two bias voltages; and
a second bias voltage generating unit outputting the other bias voltage of said two bias voltages, and
each of said first and second bias voltage generating units includes:
a plurality of voltage dividing units dividing the constant voltage applied from said constant voltage power supply unit based upon different voltage dividing ratios; and
a switch unit switching paths routed from said plurality of voltage dividing units up to an output in such a manner that any one of the voltages divided by said plurality of voltage dividing units is outputted.

11. An oscillator comprising:
an oscillating element; and
the oscillation control apparatus recited claim 1, which oscillates said oscillating element.

12. An oscillator comprising:
an oscillating element; and
the oscillation control apparatus recited claim 2, which oscillates said oscillating element.

13. An oscillation control apparatus, comprising:
an oscillating unit oscillating an oscillating element;
an output amplifying circuit having two pieces of same types of transistors series-connected to each other, and an output terminal for outputting a signal from a junction point between said two transistors in response to an oscillation signal outputted from the oscillating unit;
a bias unit generating two DC bias voltages having different levels from each other, which are applied to either respective gates or respective bases of said two transistors; and
a constant voltage power supply unit applying a constant voltage to said oscillating unit, wherein:
a same phase signal having the same phase as the oscillation signal outputted from said oscillating unit and one of said two bias voltages are applied to either the gate or the base of one of said two transistors,
an inverted phase signal having phase opposite to the oscillation signal and the other bias voltage of said two bias voltages are applied to either the gate or the base of the other transistor of said two transistors, and
the two DC bias voltages are VG1 and VG2 which are represented by:

$$VG1 = VH + Vt - VREGpp/2,$$

$$VG2 = VL + VREGpp/2, \text{ where}$$

VH is a maximum voltage of a signal output from the output amplifying circuit,
VL is a minimum voltage of the signal output from the output amplifying circuit,
Vt is a threshold voltage of the transistors, and
VREGpp is peak-to-peak amplitude of voltage applied to the gate or the base.

14. An oscillation control apparatus, comprising:
an oscillating unit oscillating an oscillating element;
an output amplifying circuit having two pieces of same types of transistors series-connected to each other, and an output terminal for outputting a signal from a junction point between said two transistors in response to an oscillation signal outputted from the oscillating unit;
a bias unit generating two DC bias voltages having different levels from each other, which are applied to either respective gates or respective bases of said two transistors; and
a constant voltage power supply unit applying a constant voltage to said oscillating unit, wherein:
a same phase signal having the same phase as the oscillation signal outputted from said oscillating unit and one of said two bias voltages are applied to either the gate or the base of one of said two transistors,
an inverted phase signal having a phase opposite to the oscillation signal and the other bias voltage of said two bias voltages are applied to either the gate or the base of the other transistor of said two transistors, and
the two DC bias voltages are VG1 and VG2 which are represented by:

$$VG1 = VH + Vt - VREGpp/2,$$

$$VG2 = Vt, \text{ where}$$

VH is a maximum voltage of a signal output from the output amplifying circuit,
VL is a minimum voltage of the signal output from the output amplifying circuit,
Vt is a threshold voltage of the transistors, and
VREGpp is peak-to-peak amplitude of voltage applied to the gate or the base.

15. The oscillation control apparatus as claimed in claim 1, further comprising:
an AC component eliminating unit eliminating an AC component of said bias voltages generated by said bias unit.

16. The oscillation control apparatus as claimed in claim 2, further comprising:
an AC component eliminating unit eliminating an AC component of said bias voltages generated by said bias unit.

17. The oscillation control apparatus as claimed in claim 1, wherein:
said bias unit includes:
a first bias voltage generating unit outputting one bias voltage of said two bias voltages; and
a second bias voltage generating unit outputting the other bias voltage of said two bias voltages, and
each of said first and second bias voltage generating units includes:

a plurality of voltage dividing units dividing the constant voltage applied from said constant voltage power supply unit based upon different voltage dividing ratios; and a switch unit switching paths routed from said plurality of voltage dividing units up to an output in such a manner that any one of the voltages divided by said plurality of voltage dividing units is outputted.

18. The oscillation control apparatus as claimed in claim 2, wherein:

said bias unit includes:

a first bias voltage generating unit outputting one bias voltage of said two bias voltages; and a second bias voltage generating unit outputting the other bias voltage of said two bias voltages, and each of said first and second bias voltage generating units includes:

a plurality of voltage dividing units dividing the constant voltage applied from said constant voltage power supply unit based upon different voltage dividing ratios; and a switch unit switching paths routed from said plurality of voltage dividing units up to an output in such a manner that any one of the voltages divided by said plurality of voltage dividing units is outputted.

* * * * *